United States Patent [19]

Riseman et al.

[11] 4,419,809

[45] Dec. 13, 1983

[54] FABRICATION PROCESS OF SUB-MICROMETER CHANNEL LENGTH MOSFETS

[75] Inventors: Jacob Riseman; Paul J. Tsang, both of Poughkeepsie, N.Y.

[73] Assignee: International Business Machines Corporation, Armonk, N.Y.

[21] Appl. No.: 335,893

[22] Filed: Dec. 30, 1981

[51] Int. Cl.³ .......................................... H01L 21/265
[52] U.S. Cl. .................................. 29/571; 29/576 B; 29/591; 148/1.5; 148/187
[58] Field of Search ..................... 29/571, 576 B, 591; 148/1.5, 187

[56] References Cited

U.S. PATENT DOCUMENTS

| | | | |
|---|---|---|---|
| 3,648,125 | 3/1972 | Peltzer | 148/187 X |
| 4,062,699 | 12/1977 | Armstrong | 148/1.5 |
| 4,089,992 | 5/1978 | Doo et al. | 427/255.1 X |
| 4,104,086 | 8/1978 | Bondur et al. | 148/1.5 |
| 4,201,603 | 5/1980 | Scott, Jr. et al. | 148/174 |
| 4,204,894 | 5/1980 | Komeda et al. | 29/571 X |
| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,256,514 | 3/1981 | Pogge | 148/1.5 |
| 4,274,909 | 6/1981 | Venkataraman et al. | 29/571 X |
| 4,287,661 | 9/1981 | Stoffel | 148/174 X |
| 4,294,002 | 10/1981 | Jambotkar et al. | 29/576 B |
| 4,322,883 | 4/1982 | Abbas et al. | 148/188 X |
| 4,358,340 | 11/1982 | Fu | 29/591 |
| 4,359,816 | 11/1982 | Abbas et al. | 148/188 X |
| 4,364,166 | 12/1982 | Crowder et al. | 29/571 |
| 4,374,700 | 2/1983 | Scott et al. | 29/571 X |

OTHER PUBLICATIONS

H. B. Pogge, IBM Technical Disclosure Bulletin, "Narrow Line-Width Masking Method", Nov. 1976, vol. 19, No. 6, pp. 2057-2058.
S. A. Abbas et al., IBM Technical Disclosure Bulletin, "Extending the Minimal Dimensions of Photolithographic . . . ", Sep. 1977, vol. 20, No. 4, pp. 1376-1378.
"A New Edge-defined Approach for Sub-micrometer MOSFET Fabrication" by W. R. Hunter et al., IEEE Electron Device Letters, vol. EDL-2, No. 1, Jan. 1981, pp. 4-6.
"Sub-micrometer Polysilicon Gate CMOS/SOS Technology" by A. C. Ipri et al., IEEE Transactions on Electron Devices, vol. ED-27, No. 7, Jul. 1980, pp. 1275-1279.
"A Novel Sub-micron Fabrication Technique" by T. N. Jackson et al., IEDM 1979, Conference vol., pp. 58-61.
"A New Short Channel MOS FET with Lightly Doped Drain" by Saito et al., in Denshi Tsushin *Rengo Taikai*, (Japanese), Apr. 1978, pp. 2-20.

*Primary Examiner*—G. Ozaki
*Attorney, Agent, or Firm*—George O. Saile

[57] ABSTRACT

Methods for fabricating a semiconductor integrated circuit having a sub-micrometer gate length field effect transistor devices are described wherein a surface isolation pattern is formed in a semiconductor substrate which isolates regions of the semiconductor from one another. Certain of these semiconductor regions are designated to contain field effect transistor devices. An insulating layer which may be designated to be in part the gate dielectric layer of the field effect transistor devices is formed over the isolation pattern surface. Then a first polycrystalline silicon layer is formed thereover. A masking layer such as silicon dioxide, silicon nitride or the like is then formed upon the first polycrystalline layer. The structure is etched to result in a patterned first polycrystalline silicon layer having substantially vertical sidewalls some of which sidewalls extend across certain of the device regions. A controlled submicrometer thickness conductive layer is formed on these vertical sidewalls. The patterned layer is then removed which leaves the pattern of sub-micrometer thickness conductive sidewall layer portions of which extend across certain of the device regions. The sidewall conductive layer is utilized as the gate electrode of the field effect transistor devices. Ion implantation is then accomplished to form the desired source/drain element for the field effect devices in the device regions. The conductive layer and resulting gate electrode may be composed of polycrystalline silicon metal silicide or polycide (a combination of layers of polycrystalline silicon and metal silicide).

26 Claims, 19 Drawing Figures

FABRICATION PROCESS OF SUB-MICROMETER CHANNEL LENGTH MOSFETS

DESCRIPTION

1. Technical Field

This invention relates to methods for manufacturing integrated circuits which have field effect transistor devices therein having a sub-micrometer gate length.

2. Cross References to Related Applications (1) Patent application Ser. No. 335,891, filed Dec. 30, 1981, entitled "Sub-micrometer Channel Length Field Effect Transistor Process and Resulting Structure", by R. C. Dockerty.

(2) Patent application Ser. No. 335,953, filed Dec. 30, 1981, entitled "MOSFET Structure and Process to Form Micrometer Long Source/Drain Spacing", by R. C. Dockerty and F. H. De La Moneda.

(3) Patent application, Ser. No. 335,892, filed Dec. 30, 1981 entitled "Self-aligned Field Effect Transistor Process", by J. Riseman.

(4) Patent application, Ser. No. 335,894, filed Dec. 30, 1981, entitled "A Method to Fabricate Stud Structure for Self-aligned Metalization", by S. A. Abbas and I. E. Magdo.

BACKGROUND ART

The integrated circuit technology has a need to obtain narrow line widths in the range of 1 micrometer or less by extending standard photolithography techniques and avoiding the need to use the more expensive and complex techniques such as electron beam or X-ray lithography. One such technique is described in H. B. Pogge in IBM Technical Disclosure Bulletin, Nov. 1976, Vol. 19, No. 6, pp. 2057-2058, entitled "Narrow Line Widths Masking Method". This method involves the use of a porous silicon followed by the oxidation of the porous silicon. Another technique is described by S. A. Abbas et al. in the IBM Technical Disclosure Bulletin, Vol. 20, No. 4, Sept. 1977, pp. 1376-1378. This method describes the use of polycrystalline silicon masking layers which are made into mask by first using an intermediate mask of oxidation blocking material, such as silicon nitride in the formation of polycrystalline silicon. Line dimensions below about 2 micrometers may be obtained by this technique.

U.S. Pat. Nos. 4,209,349 and 4,209,350 by I. T. Ho et al., U.S. Pat. No. 4,234,362 by J. Riseman and U.S. Pat. No. 4,256,514 by H. B. Pogge describe methods for forming narrow dimensioned, for example, sub-micrometer regions on a silicon body. These patents all involve the formation of substantially horizontal surfaces and substantially vertical surfaces on a silicon body and then forming a layer of a very narrow dimension on both the substantially horizontal and substantially vertical surfaces. This layer is then subjected to an anisotropic etching process such as by reactive ion etching, to substantially remove the horizontal layer while leaving the vertical layer substantially intact. The vertical layer dimension is adjusted depending upon the original thickness of the layer applied. In this way such a narrow dimension region as 1 micrometer or less is obtained.

There has been significant effort in the integrated circuit field to develop processes for making submicrometer channel length field effect transistors with a high degree of channel length control. Examples of this work are described in "A New Edge-defined Approach for Sub-micrometer MOSFET Fabrication" by W. R. Hunter et al., IEEE Electron Device Letters, Vol. EDL-2 No. 1, January 1981, pp. 4-6, "Sub-micrometer Polysilicon Gate CMOS/SOS Technology" by A. C. Ipri et al. published in IEEE Transactions on Electron Devices, Vol. ED-27, No. 7, July 1980, pp. 1275-1279 and "A Novel Sub-micron Fabrication Technique" by T. N. Jackson et al. published in IEDM 1979 Conference Volume, pp. 58-61. The first paper relies on the reactive ion etching technique to form a sidewall silicon dioxide. The second paper utilizes a technique involving lateral diffusion of boron. The third method uses the plating of a metal on the edge of a conventionally patterned metal layer. Other short channel field effect transistor devices are illustrated in the W. E. Armstrong U.S. Pat. No. 4,062,699; J. Goel U.S. Pat. No. 4,145,459 and J. H. Scott, Jr. U.S. Pat. No. 4,201,603. The Armstrong patent utilizes an ion implantation and diffusion process to narrow the channel length of his MOSFET. The Goel patent utilizes a process sequence that involves the use of a recess formed in the portion of the semiconductor body and further involves the plating of metal films on each side of the recess until the spacing between the metal films across the recess is equal to desired length of the gate. The Scott, Jr. patent controllably dopes an edge of a polysilicon layer and then is able to remove the undoped polysilicon by etching it with a material which does not etch the doped polysilicon region. The above mentioned U.S. Pat. No. 4,209,349 and 4,209,350 also show processes for making sub-micrometer channel length devices with highly doped drain/source.

A particularly effective MOS FET configuration allowing densities and performance higher than that heretofore available in such devices is described in "A New Short Channel MOS FET with Lightly Doped Drain" by Saito et al. in Denshi Tsushin *Rengo Taikai* (Japanese), April 1978, page 2-20. The LDD N channel MOS FET includes, in addition to the channel separating implanted N+ source and drain regions, the sub-micrometer diffused N− regions, which increases the channel breakdown voltage or snap-back voltage and reduces device drain junction electron impact ionization (and thus, hot electron emission) by spreading the high electric field at the drain pinch-off region into the N− region. This allows either an increase in power supply voltage or reduction in channel length at a given voltage to achieve performance enhancement. An improved process for making such a device is given in U.S. Pat. No. 4,366,613 S. Ogura and P. J. Tsang and entitled "Method of Fabricating High Speed High Density MOS Dynamic RAM With Lightly Doped Drain", in which the N− LDD region of the device is formed by a controlled N− ion implantation and the forming of sub-micrometer wide $SiO_2$ sidewall spacers abutting to the gate.

In the above mentioned Ogura's and Tsang's patent, the polycrystalline silicon gate plate of the LDDFET is formed by conventional lithographic process. Its minimum achievable length is limited by the capability of the lithographic tool used. In the present invention, on the other hand, the self-aligned sidewall formation technique is repeatedly used to form the sub-micrometer length gate and the LDD sidewall spacers of the device. The minimum achievable device gate length is no longer limited by the lithographic tools but can be set by design requirement. Devices with channel length less than 0.5 micrometers can be readily made with conventional photolithographic tool.

SUMMARY OF THE PRESENT INVENTION

In accordance with the present invention a method for fabricating a semiconductor integrated circuit structure having a sub-micrometer gate length field effect transistor devices is described wherein a surface isolation pattern is formed in a semiconductor substrate which isolates regions of the semiconductor within the substrate from one another. Certain of these semiconductor regions are designated to contain field effect transistor devices. A silicon dioxide layer which may be designated to be in part the gate dielectric layer of the field effect transistor devices is formed over the isolation pattern surface. Then a first polycrystalline silicon layer is formed thereover. A masking layer such as silicon dioxide, silicon nitride or the like is then formed upon the first polycrystalline silicon layer. The multilayer structure is etched to result in a patterned first polycrystalline silicon layer having substantially vertical sidewalls some of which sidewalls extend across certain of the device regions. A controlled sub-micrometer thickness conductive layer is formed on these vertical sidewalls. The patterned layer is then removed which leaves the pattern of sub-micrometer thickness conductive silicon sidewall layer portions of which extend across certain of the device regions. The sidewall conductive layer is utilized as the gate electrode of the field effect transistor devices. Ion implantation is then accomplished adjacent to the gate electrode to form the desired source/drain element for the field effect devices in the device regions. The conductive layer and resulting gate electrode may be composed of polycrystalline silicon, metal silicide, polycide (a combination of layers of polycrystalline silicon and metal silicide) or the like.

A further method embodiment for fabricating a semiconductor integrated circuit structure having submicrometer gate length field effect transistor devices is described wherein a surface isolation pattern is formed in a semiconductor substrate which isolates regions of the semiconductor within the substrate from one another. Certain of these semiconductor regions are designated to contain field effect transistor devices. A silicon dioxide layer which may be designated to be in part the gate dielectric layer of the field effect transistor devices is formed over the isolation pattern surface. Then a first polycrystalline silicon layer is formed thereover. A second silicon dioxide is deposited over the polycrystalline silicon layer. The multilayer structure is etched to result in a patterned second silicon dioxide layer having substantially vertical sidewalls some of which sidewalls extend across certain of the device regions. A controlled sub-micrometer thickness conductive layer is formed on these vertical sidewalls. The patterned layer is then removed which leaves the pattern of sub-micrometer thickness conductive sidewall layer portions of which extend across certain of the device regions. The second polycrystalline silicon sidewall layer is then used as etch mask for the first polycrystalline silicon layer, resulting in patterned sidewall polycrystalline silicon spacer consisting of the first and the second polycrystalline silicon layers. The sidewall conductive layer is utilized as the gate electrode of the field effect transistor devices. Ion implantation is then accomplished adjacent to the gate electrode to form the desired source/drain element for the field effect devices in the device regions. As in the above paragraph the conductive layer may be composed of polycrystalline silicon, metal silicide, a combination of polycrystalline silicon and metal silicide or the like.

DISCLOSURE OF THE INVENTION

Referring now more particularly to FIGS. 1 through 10 there is illustrated an embodiment for fabricating a sub-micrometer channel length field effect transistor in a high density integrated circuit structure. The process is illustrated to form N channel MOS FET integrated circuits. However, it would be obvious that P channel field effect transistors can alternatively be formed by the present embodiment by simply reversing the polarity of the various elements of the transistors and associated regions.

Figure 1:
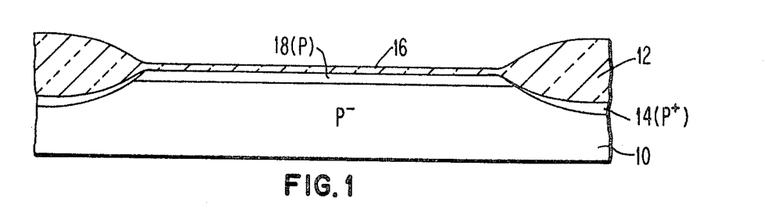
FIGS. 1 through 10 schematically illustrate a first process embodiment for forming sub-micrometer channel length field effect transistors.

The first series of steps involve the formation of the isolation means for isolating regions of monocrystalline silicon from other regions of monocrystalline silicon in a P− <100> crystallographic oriented silicon substrate 10 as thus can be seen with reference to FIG. 1. The isolation may preferably be partial dielectric isolation using materials such as silicon dioxide, glass, polyimide, etc., alone or in combinations. The preferred pattern of partial dielectric isolation 12 define monocrystalline silicon surface regions wherein field effect devices will ultimately be formed. There are many ways in the art to form dielectric isolation regions of this type. It is preferred to use the process described in the Magdo et al. patent application Ser. No. 150,609 filed June 7, 1971 or Peltzer U.S. Pat. No. 3,648,125. Alternately, the process described in the J. A. Bondur et al. U.S. Pat. No. 4,104,086 can be used. In that patent application and patent's processes for forming partial dielectric isolation region 12 are described in detail. A P+ region 14 is typically formed under the dielectric isolation layer region 12 to prevent a formation of an inversion layer and the resulting electrical leakage between isolated monocrystalline regions under the isolation region 12.

Briefly, the recessed dielectric isolation region 12 and 14 may be formed by first thermally oxidizing the surface of the silicon substrate 10 to form silicon dioxide layer (not shown) thereon. A silicon nitride layer (not shown) is then deposited by chemical vapor deposition thereover. The silicon nitride layer has openings formed therein at the desired location of the isolation regions by conventional lithography and etching techniques. The P+ region 14 is formed by the ion implantation of boron through the silicon dioxide layer in the opening in the silicon nitride layer. The silicon nitride layer forms an effective mask to the penetration of the boron ions in the remaining areas covering the surface of the wafer. The recessed oxide isolation region 12 is then grown by placing the wafer in a oxidation ambient for time sufficient to form the recessed oxidation regions 12. The silicon nitride and silicon dioxide layers are now removed from the surface of the silicon wafer. The surface isolation pattern in the semiconductor silicon substrte which isolates regions of the semiconductor within the substrate from one another is now formed.

A first insulating layer 16 is formed on the surface of the silicon body 10. This layer is preferably thermally grown silicon dioxide which may be designated to be in part the gate dielectric layer upon the surface of the silicon substrate. However, the layer may alternatively be composed of silicon dioxide, silicon nitride, aluminum oxide or the like or combinations of the foregoing. The layer is preferably thermally grown in oxygen or oxygen-water vapor ambient at a temperature of about 950° C. to form a thermal silicon dioxide layer. The preferred thickness of this layer is about 15 to 50 nanometers. A second method for growing silicon dioxide involves the use chemical vapor deposition process wherein $SiH_4$ and $O_2$ at about 450° C. or $SiH_2Cl_2$ and $N_2O$ at a temperature of about 800° C. under atmospheric or low pressure conditions. The deposition of silicon nitride is usually formed by chemical vapor deposition using the following process conditions: $SiH_4$, $NH_3$ and $N_2$ carrier gas at a temperature of about 800° C. under atmospheric or low pressure conditions as described, for example, in the V. Y. Doo U.S. Pat. No. 4,089,992. Where the insulating layer is formed of a combination of silicon dioxide and silicon nitride the thickness of these layers are, for example, of 10 to 20 nanometers silicon nitride and 10 to 40 nanometers silicon dioxide.

The surface conductivity of the P− substrate 10 is adjusted where the field effect transistors are to be formed. The threshhold voltage of the FET, Vt, is adjusted by using for example a boron ion implantation of about $1 \times 10^{12}/cm^2$ dosage at approximately 70 KeV to produce surface P region 18.

There is now deposited a first polycrystalline silicon layer 20 over the entire surface having the surface isolation pattern and over the silicon dioxide layer 16. An undoped or lightly doped P-type polycrystalline silicon layer is deposited by using, for example, silane in a hydrogen ambient in the temperature range of about 500° C. to 1,000° C. and preferably about 600° C. The operative thickness of the polycrystalline silicon is between about 300 to 1000 nanometers with 600 nanometers preferred. The polycrystalline silicon layer in this embodiment makes no electrical contact to the silicon body 10 since it is formed upon the first insulating layer 16.

Figure 2:
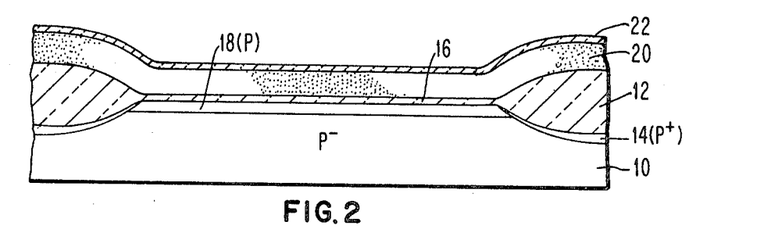

A silicon nitride layer 22 which may be, for example, about 50 to 100 nanometers in thickness is deposited by chemical vapor deposition by decomposing silane in ammonia at 800° C. to produce the FIG. 2 structure. Other insulating layers or combination of layers can be substituted for the silicon nitride. Also other silicon nitride deposition processes can be utilized.

Figure 3:
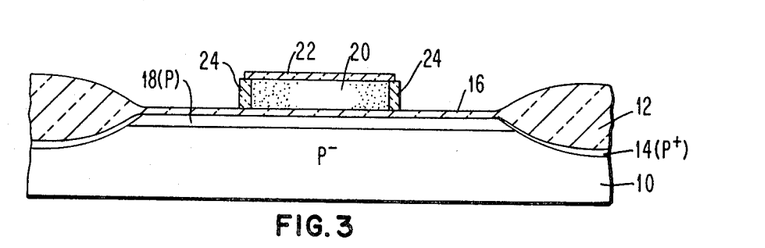
Figure 4:
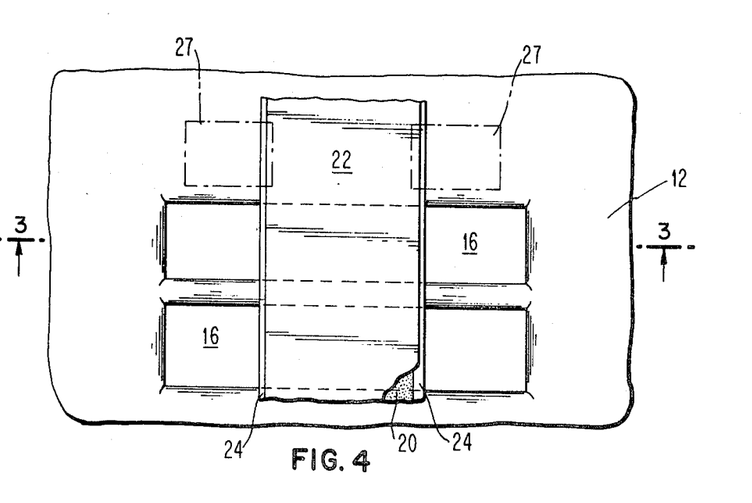

The process for forming a controlled sub-micrometer thickness layer on vertical sidewalls of the first polycrystalline silicon layer 20 may be better understood with reference to FIGS. 3–7. Standard lithography and etching techniques are used to form a silicon nitride layer 22 mask and in turn to produce the remaining portions of the first polycrystalline silicon layer 20 having substantially vertical sidewalls which extend across certain of the designated device regions and continue onto the surrounding isolation pattern. The vertical sidewalls are then subjected to a thermal oxidation to form a thin layer 24 of about 50 to 100 nanometers of silicon dioxide thereon. The resulting structure is shown in FIG. 3 and plane view FIG. 4 wherein FIG. 3 is taken along cross-section 3:3. The dashed regions 27 are the planned locations of gate electrode contact resist blockout masks to be used when etching second polycrystalline silicon layer 26. The first polycrystalline silicon etching step is preferably an anisotropic etching process using chlorinated hydrocarbon gases such as described in J. S. Lechaton and J. L. Mauer, "A Model for the Etching of Silicon in a $Cl_2$/Ar Plasma", in Plasma Process—Proc. Sym. on Plasma Etching & Deposition, R. G. Frieser and C. J. Mogab, Editors, The Electrochem. Society, (1981), pp. 75–85 or the Harvilchuck et al. patent application Ser. No. 594,413, filed July 9, 1975, now abandoned and continuation patent application Ser. No. 960,322 filed 11/13/78.

Figure 5:
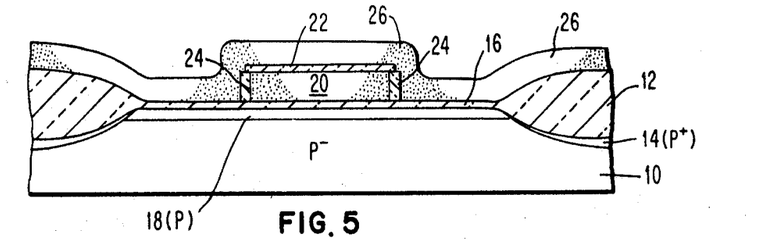

The next step is to form a controlled sub-micrometer thickness layer on the sidewalls of the first polycrystalline silicon pattern 20. This is preferably accomplished in this embodiment by depositing a second polycrystalline layer 26. The deposition process very effectively controls the thickness of the polycrystalline silicon layer. The layer 26 uniformly forms upon all the horizontal and vertical surfaces to the substantially identical thickness. The thickness of the second polycrystalline silicon layer 26 is between about 200 to 950 nanometers depending upon the design value of device gate length and doped with N+ dopant such as arsenic, or phosphorus. The second polycrystalline silicon layer may alternatively be doped as deposited or may be deposited substantially undoped and then doped by a subsequent ion implantation and heating process. It is preferred to use the subsequent ion implantation doping of the first polycrystalline silicon layer 20. The N+ doping of the layer 20 may be by an ion implantation process using between about $1 \times 10^{15}$ to $1 \times 10^{16}$ ions/cm$^2$ at between about 30 to 100 Kev. The preferred dopant is arsenic.

Figure 6:
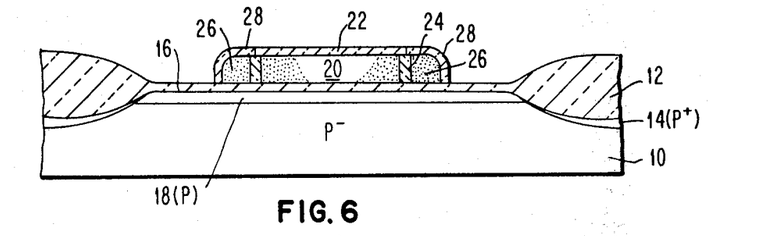

The layer 26 is now subjected to anisotropic etching to substantially remove the layer 26 from the horizontal surfaces and leave the polycrystalline silicon sidewall layer on the substantially vertical surfaces as shown in FIG. 6. The etching process is identical to the one described in regard to the etching of the first polycrystalline layer above.

A thin layer 28 of about 100 nanometers in thickness of silicon dioxide is thermally grown on the layer 26 to complete the gate electrode studs of the field effect transistors being fabricated. The remaining portion of the polycrystalline silicon layer 20 and silicon nitride layer 22 are selectively removed such as by etching in a wet chemical etchant of $H_3PO_4$ solution for silicon nitride and that of ethylenediamine-pyrocatechol-water solution for polycrystalline silicon to leave the FIG. 7 structure with sub-micrometer gate electrode studs 26 remaining, are described in A. Reisman, M. Berkenblit, S. A. Chan, F. B. Kaufman, and D. C. Green, "The Controlled Etching of Si in Catalyzed Ethylenediamine-Pyrocatechol-Water Solutions", J. Electrochem. Soc. Vol. 126, pp. 1406–1415 (1979), by reactive ion etching for both layers, or any combination of these two etching methods.

Figure 7:
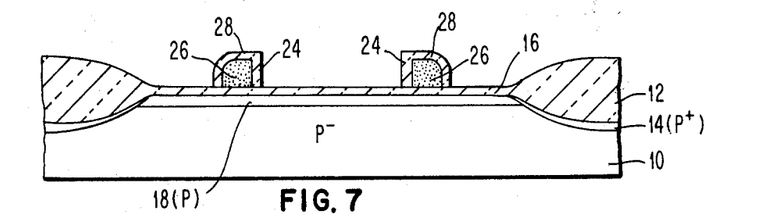
Figure 8:
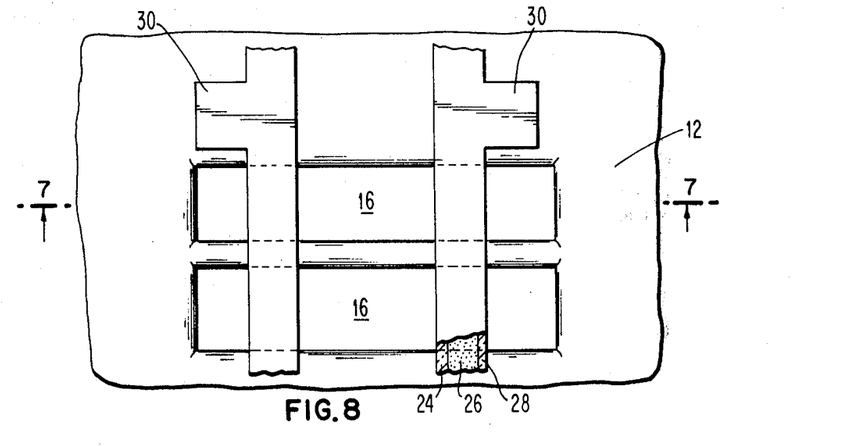

For the ease of providing electrical contact to the sub-micrometer gate electrode, a blocking resist mask can be used before the anisotropic etching of the layer 26 so that a contact pad 30 of polycrystalline silicon layer 26 situated over the isolation 12 for each gate electrode as can be seen in plane view FIG. 8. FIG. 7 is a cross-section of FIG. 8 taken along 7—7.

Figure 9:
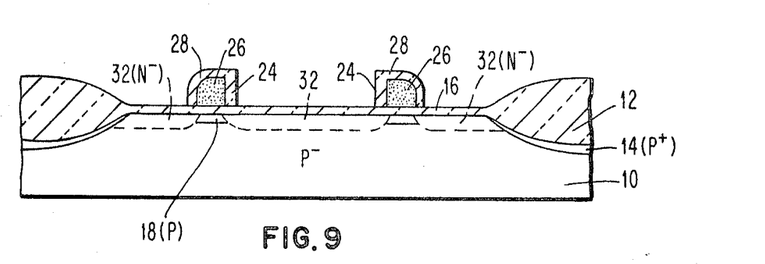
Figure 10:
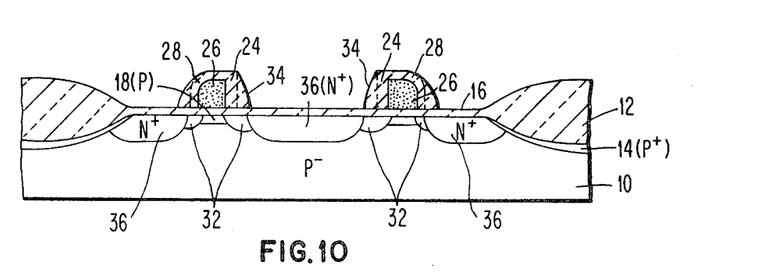

The exposed gate dielectric silicon dioxide layer 16 can either be removed by etching followed by the ion implantation or diffusion of phosphorus or arsenic dopants, or the silicon dioxide layer can be allowed to remain and ion implantation used to penetrate the silicon dioxide layer to form the N− lightly doped source-/drain regions 32 in the device areas. Where the first alternative is utilized it is necessary to reoxidize the exposed silicon surface to form a silicon dioxide layer thereon. It is preferred to blanket implant arsenic or phosphorus ions of a dosage of between about $1 \times 10^{12}$ to $1 \times 10^{13}$ ions/cm² at about 40 to 100 KeV through the layer 16. It should be noted that due to the lateral diffusion of the N− region the spacing between the implanted lightly doped source and drain regions 32 is determined by the width of the sidewall gate electrode layer 26 minus twice the lateral diffusion length of the N− regions. FIG. 9 is the result of the implantation. There is now deposited a controlled sub-micrometer thickness silicon dioxide or other insulating material layer 34 over the entire surface of the structure wherein field effect transistor devices are to be formed. The layer 34 uniformly forms upon all of the horizontal and vertical surfaces to the identical thickness. The thickness of the silicon dioxide layer 34 is between about 200 to 750 nanometers and preferably 400 nanometers. The silicon dioxide layer is formed by low pressure chemical vapor deposition at temperature of 400° C. using SiH₄ and nitrous oxide as source material. The layer 34 is now subjected to an anisotropic etching to substantially remove the layer 34 from the horizontal surfaces and leave the silicon dioxide sidewall layer 34 on the substantially vertical surfaces as shown in FIG. 10. The etching is done in a reactive ion etching, (RIE), system using CF₄+38% H₂ gases as described in L. M. Eprath, J. Electrochem. Soc. Vol. 124, p. 284C (1977).

The N+ source/drain ion implantation to form source/drain regions 36 is now accomplished by arsenic ion implantation with dose ranges from $1 \times 10^{15}$/cm² to $1 \times 10^{16}$/cm² and energy of 40 to 80 KeV, followed by dopant drive-in treatment at 900°–1000° C. for 30–60 minutes. The resulting N+ source/drain region has a surface dopant concentration of $1-2 \times 10^{20}$/cm³ and junction depth of about 0.1–0.5 μm.

Sputtered or plasma deposited SiO₂, plasma deposited silicon nitride, polyimide or a combination of these materials are now deposited over the active device monocrystalline silicon surface to passivate this surface. This is done by conventional procedures as are known in the art. Openings are made in the layer or layers to the elements of the devices. Metals such as aluminum, aluminum-copper doped polysilicon, or the like, are used to fill the openings as ohmic contacts to the devices. The metal layers are patterned to connect the various devices into the desired integrated circuits.

Figure 11:
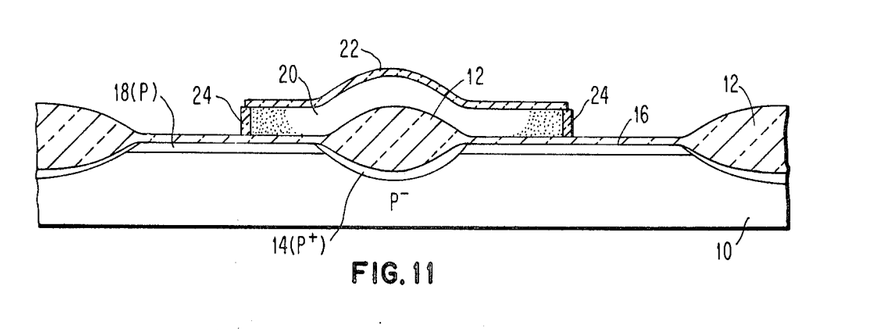
FIGS. 11 and 12 show a modification of the embodiment of FIGS. 1–10.
Figure 12:
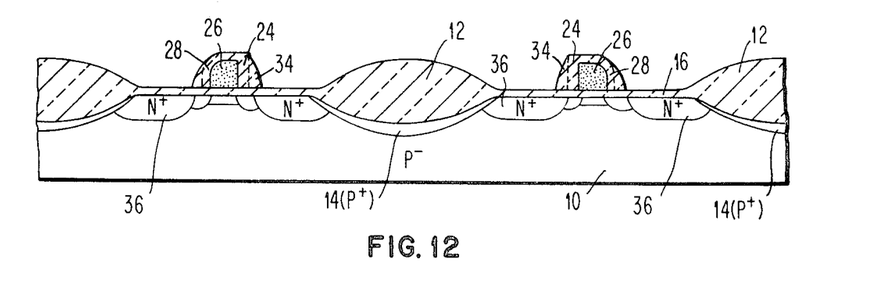

A modification of the FIG. 1 through 10 process is illustrated in FIGS. 11 and 12. This process differs from the initial first embodiment by delineating the first polycrystalline layer 20 over one of recessed oxide isolation regions 12 as shown in the FIG. 11 structure. Under this circumstance the second polycrystalline silicon sidewall 26 will form a single such sidewall on each of the two monocrystalline silicon isolated regions as seen in FIG. 12. FIG. 12 should be compared to the FIG. 10 of the earlier embodiment wherein the FIG. 10 embodiment results in two field effect transistors having a common element while the FIG. 12 structure results in two fully isolated field effect transistors. All other process steps remain the same as indicated by like numbers.

Figure 13:
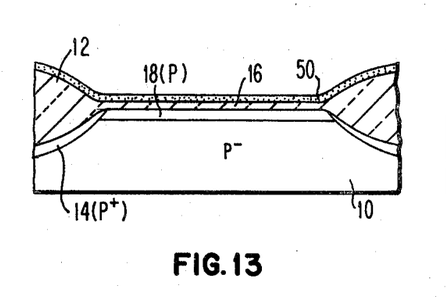
FIGS. 13–19 show a second process embodiment for forming sub-micrometer channel length field effect transistors.
Figure 14:
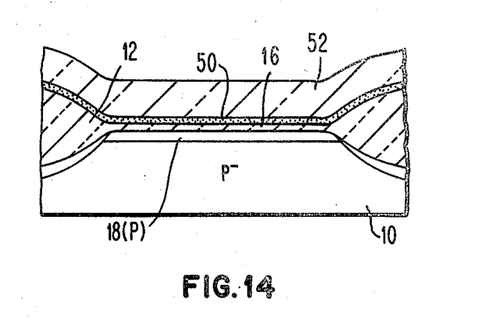
Figure 15:
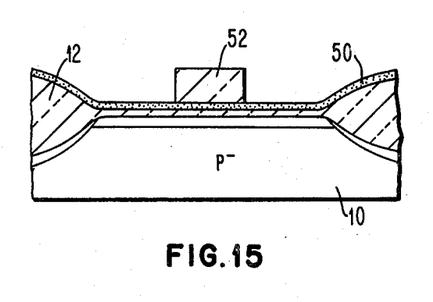

Referring now more particularly to FIGS. 13 through 19, there is shown a still further embodiment for making sub-micrometer silicon gate field effect transistors. The method has the advantage over the earlier method of being particularly simple to manufacture and in that there is no need to regrow the silicon dioxide dielectric on the sidewalls of the patterned polycrystalline silicon gate. The isolated monocrystalline silicon regions by means of recessed oxide isolated structures 12 together with the growth of silicon dioxide insulating layer 16 and the threshold adjust region 18 are all formed according to the process described in connection with the FIG. 1 structure as indicated by like numbers. Upon such structure a first polycrystalline silicon layer 50 is deposited thereover as shown in FIG. 13. A second insulating layer which is preferably silicon dioxide is deposited by low pressure chemical vapor deposition process using silane (SiH₄) and nitrous oxide as source material.

Figure 16:
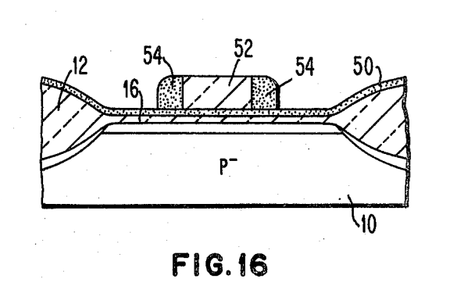

The thickness of this layer is 500 to 2000 nanometers and it is preferred that the thickness is 1000 nanometers. A pattern is formed in the silicon dioxide layer 52 by conventional lithographic and etching techniques. It is preferred that anisotropic reactive ion etching is utilized to form the FIG. 15 structure. It is necessary that the sidewalls of this pattern in the silicon dioxide insulating layer 52 are substantially vertical. A second polycrystalline layer 54 is now uniformly deposited and conductively doped to form a control sub-micrometer thickness layer uniformly upon all of the horizontal and vertical surfaces to identical thicknesses in the manner described in regard to the first embodiment's layer 26. The layer 54 is now subjected to an anisotropic etching to substantially remove the layer 54 from the horizontal surfaces and leave the polycrystalline silicon sidewall layer 54 on the substantially vertical surfaces as shown in FIG. 16. The etching process is identical to the one described in relation to the first polycrystalline silicon layer in the first embodiment.

Figure 17:
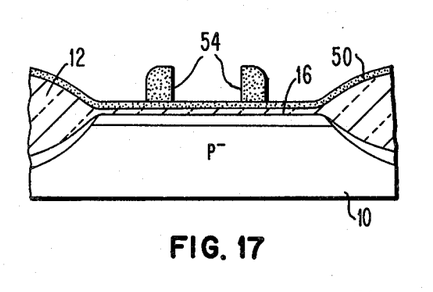
Figure 18:
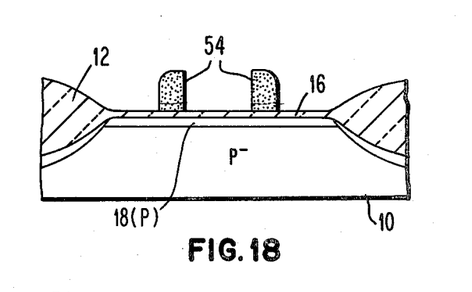

The remaining portion of the insulating layer 52 is removed by etching such as buffered HF solution or reactive ion etching to produce the FIG. 17 structure. The FIG. 17 structure is now subjected to anisotropic reactive ion etching and the second polycrystalline silicon layer 54 is used as a mask to remove the first polycrystalline silicon layer 50 to produce the FIG. 18 structure.

Figure 19:
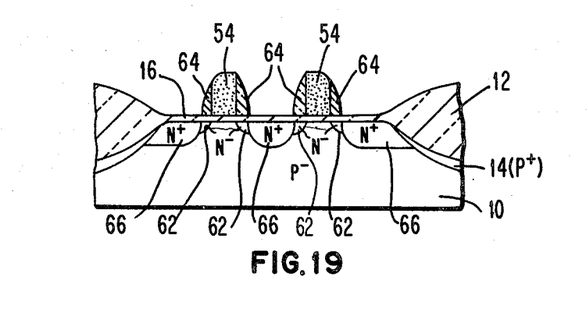

The exposed gate dielectric silicon dioxide layer 16 can be removed by etching followed by ion implantation or diffusion of the phosphorus or arsenic dopants. Preferably the silicon dioxide layer 16 can be allowed to remain and ion implantation used to penetrate the silicon dioxide layer to form the lightly doped N source-/drain regions 62 in the device areas. It is preferred to blanket ion implant arsenic or phosphorus ions of a dosage of between about $1 \times 10^{12}$ to $1 \times 10^{13}$ ions/cm² at between about 40 to 100 KeV. A uniform insulating layer 64 which is typically silicon dioxide is deposited over the device surface of the FIG. 18 structure. It is controlled to a thickness of between about 200 to 750 nanometers and preferably 400 nanometers. A plasma enhanced etching is accomplished according to the described processes above for a silicon dioxide layer to anisotropically remove the substantially horizontal portions of layer 64 while leaving the substantially vertical sidewall layers on the sides of the designated gate electrodes 54. The result of this process is shown in FIG. 19. The structure is then subjected to an N+ arsenic or phosphorus ion implantation utilizing a dosage of between about $1\times10^{15}$ to $1\times10^{16}$ ions/cm$^2$ at about 40 to 80 KeV to produce the source/drain regions 66.

The passivation and interconnection metallurgy layers are now provided on the structure in the identical manner to that described in the earlier structure in the first embodiment structure of FIGS. 1 through 10.

To further improve the electrical conductivity of the device gate electrode, refractory metal silicide, e.g., WSi$_2$, TaSi$_2$, PdSi$_2$, PtSi$_2$ or the like, or the so-called polycide film that consists of a layer of metal silicide in combination with a layer or layers of polycrystalline silicon, can be used to replace certain of the polycrystalline silicon layers in the first, the second embodiments, to form the device gate electrode therein. Metal silicide layer thickness, for example, would range from about 150 to 500 nanometers. The polycide thickness would range from about 200 to 400 nanometers polycrystalline silicon and 150 to 500 nanometers metal silicide.

While the invention has been particularly shown and described with reference to the preferred embodiments thereof, it will be understood by those skilled in the art that various changes in form and detail may be made therein without departing from the spirit and scope of the invention. For example, since this technology can be applied to N channel devices and P channel devices separately, it was obvious for people skilled in the art to combine the two and develop through some additional steps a complementary FETMOS field effect transistor self-aligned metal technology.

What is claimed is:

1. Method of forming short channel length field effect transistors comprising:
    forming a first polycrystalline silicon layer on a silicon dioxide coating on the surface of a monocrystalline silicon substrate of on conductivity type;
    forming a silicon nitride layer over said first layer;
    removing portions of said insulator layer and said first polycrystalline silicon layer down to said silicon dioxide coating to produce openings having substantially vertical sidewalls on the remaining said insulator layer and polycrystalline silicon layer;
    thermally oxidizing the exposed said sidewalls of said first polycrystalline silicon layer to produce a silicon dioxide layer thereon;
    depositing a conductive layer over the various substantially vertical and substantially horizontal surfaces;
    anisotropically etching said conductive line layer to substantially remove all of said second layer from the horizontal surfaces while leaving said conductive layer on said vertical surfaces;
    oxidizing to form a silicon dioxide layer upon the remaining said conductive layer;
    removing the remaining said silicon nitride layer and said first polycrystalline silicon layer to define the gate regions of said field effect transistors by said remaining conductive layer and form the gate electrodes in the said conductive layer;
    ion implanting a conductivity imparting impurity of an opposite conductivity type to said one type into said silicon substrate to form the source/drain regions using the said remaining said silicon dioxide layer over said second layer as the mask of the channel of the field effect transistor; and
    electrically ohmic contacting said source/drain regions and said gate electrodes.

2. The method of claim 1 wherein said second conductive layer is a second polycrystalline silicon.

3. The method of claim 2 wherein a lightly doped drain structure is formed and further comprising forming an N− region in said substrate using said second polycrystalline silicon layer having said silicon dioxide layer thereon as a mask;
    forming a sidewall silicon dioxide layer upon the said substantially vertical surfaces of said second polycrystalline silicon layer; and
    completing said lightly doped drain structure by said ion implanting of N+ type said conductivity imparting impurities.

4. The method of claim 3 wherein said sidewall silicon dioxide layer has a thickness of between about 200 to 750 nanometers which delineates said lightly doped drain regions by such an amount.

5. The method of claim 3 wherein said forming an N− region is by ion implantation using 1 to $10\times10^{12}$ ions/cm$^2$ at 40 to 100 KeV and said ion implanting of N+ type conductivity imparting impurity using 1 to $10\times10^{15}$ ions/cm$^2$ and 40 to 100 KeV.

6. The method of claim 5 wherein said conductivity imparting impurity is 1 to $2\times10^{20}$/cm$^3$.

7. The method of claim 2 wherein said second polycrystalline layer has a thickness of between about 200 to 950 nanometers which produces a field effect transistor with said short channel length of substantially the same dimensions as said second polycrystalline silicon layer.

8. The method of claim 2 wherein said second polycrystalline layer is N+ and is doped by an ion implantation process after its deposition using between about $1\times10^{15}$ to $1\times10^{16}$ ions/cm$^2$ at between about 30 to 100 KeV.

9. The method of claim 1 wherein said second conductive layer is a combination layer of polycrystalline silicon with metal silicide thereon.

10. The method of claim 1 wherein said second conductive layer is a metal silicide.

11. The method of claim 1 wherein said surface of said monocrystalline silicon substrate is isolated from other such regions by a surface isolation pattern in said substrate.

12. The method of claim 6 wherein said surface isolation pattern is substantially silicon dioxide.

13. The method of claim 11 wherein said first polycrystalline silicon layer is patterned by said removing portions of said first polycrystalline silicon layer so as to overlap said isolation pattern and partially cover two of said regions of monocrystalline silicon whereby single said field effect transistors are formed in each of said two regions.

14. Method of forming short channel field effect transistors comprising:
    forming a first silicon dioxide layer upon the surface of a monocrystalline silicon substrate of a one conductivity type;
    forming a first polycrystalline silicon layer upon said first silicon dioxide layer;
    forming a second layer of silicon dioxide upon said first polycrystalline silicon layer;
    removing portions of said second layer of silicon dioxide to produce openings in said second layer having substantially vertical sidewalls on the remaining said second layer of silicon dioxide;

depositing a conductive layer over the various substantially vertical and substantially horizontal surfaces;

anisotropically etching said conductive layer to substantially remove all of said conductive layer from the horizontal surfaces while leaving said conductive layer on said vertical surfaces;

removing the remaining said second layer of silicon dioxide;

forming a sidewall insulating layer upon the said substantially vertical surfaces of said conductive layer;

ion implanting conductivity imparting impurities of an opposite conductivity type to said one type into said silicon substrate to form the source/drain regions using the remaining said sidewall insulating layer and conductive layer as the mask of the channel; and electrically ohmic contacting said source/drain regions and the remaining said conductive layer areas acting as the gate electrode for said field effect transistors.

15. The method of claim 14 wherein said conductive layer is a second polycrystalline layer.

16. The method of claim 15 wherein a lightly doped drain structure is formed and further comprising forming an N− region in said substrate using second polycrystalline silicon layer as a mask just prior to the formation of said sidewall silicon dioxide layer so that said lightly doped drain structure is completed by said ion implantation of N+ type said conductivity imparting impurities.

17. The method of claim 16 wherein said sidewall silicon dioxide layer has a thickness of between about 200 to 750 nanometers which delineates said lightly doped drain regions by such an amount.

18. The method of claim 16 wherein said forming an N− region is by ion implantation using between about $1 \times 10^{12}$ to $1 \times 10^{13}$ ions/cm$^2$ at between about 40 to 100 KeV and said ion implanting of N+ type using between about $1 \times 10^{15}$ to $1 \times 10^{16}$ ions/cm$^2$ and between about 40 to 80 KeV.

19. The method of claim 18 wherein said conductivity imparting impurity is N− type.

20. The method of claim 15 wherein said sidewall insulating layer is silicon dioxide layer and is formed by depositing a controlled and uniform thickness layer of silicon dioxide over the horizontal and vertical surfaces of said second polycrystalline layer and openings therein followed by an anisotropic etching process which removes the substantially horizontal said silicon dioxide layer while leaving said sidewall silicon dioxide layer on the vertical surfaces.

21. The method of claim 15 wherein said second polycrystalline layer has a thickness of between about 200 to 950 nanometers which produces a field effect transistor with said short channel length of substantially the same dimensions as said second polycrystalline layer.

22. The method of claim 15 wherein said second polycrystalline layer is N+ and is doped by an ion implantation process after its deposition using between about $1 \times 10^{15}$ to $1 \times 10^{16}$ ions/cm$^2$ at between about 40 to 80 KeV.

23. The method of claim 14 wherein said conductive layer is a combination layer of polycrystalline solution with metal silicide thereon.

24. The method of claim 14 wherein said conductive layer is a metal silicide.

25. The method of claim 14 wherein said surface of said monocrystalline silicon substrate is isolated from other such regions by an at least substantially silicon dioxide isolation pattern in said substrate.

26. The method of claim 25 wherein said second layer of silicon dioxide is patterned by said removing portions of said second layer of silicon dioxide so as to overlap said isolation pattern and partially cover two of said regions of monocrystalline silicon whereby single said field effect transistors are formed in each of said two regions.

* * * * *